(12) United States Patent
Chikamatsu et al.

(10) Patent No.: US 7,692,187 B2
(45) Date of Patent: Apr. 6, 2010

(54) ORGANIC SEMICONDUCTOR MATERIAL AND ORGANIC DEVICE USING THE SAME

(75) Inventors: Masayuki Chikamatsu, Ibaraki (JP); Atsushi Itakura, Ibaraki (JP); Tatsumi Kimura, Ibaraki (JP); Satoru Shimada, Ibaraki (JP); Yuji Yoshida, Ibaraki (JP); Reiko Azumi, Ibaraki (JP); Kiyoshi Yase, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 506 days.

(21) Appl. No.: 11/723,537

(22) Filed: Mar. 20, 2007

(65) Prior Publication Data

US 2007/0215872 A1    Sep. 20, 2007

(30) Foreign Application Priority Data

Mar. 20, 2006    (JP) .............................. 2006-076111

(51) Int. Cl.
*H01L 51/30* (2006.01)
(52) U.S. Cl. .......... 257/40; 257/E51.005; 257/E51.025; 257/E51.039; 438/99; 977/738; 977/740; 977/936
(58) Field of Classification Search ............ 257/40, 257/E51.004, E51.005, E51.006, E51.007, 257/E51.025, E51.039, E21.299; 438/99; 977/734, 735, 736, 737, 738, 740, 892, 900, 977/932, 936

See application file for complete search history.

(56) References Cited

U.S. PATENT DOCUMENTS 6,162,926 A * 12/2000 Murphy et al. .............. 548/417
6,399,785 B1 * 6/2002 Murphy et al. .............. 506/15

(Continued)

FOREIGN PATENT DOCUMENTS

JP          2006-060169 A        3/2006

OTHER PUBLICATIONS

S. Kobayashi et al., "Fabrication and Characterization of $C_{60}$ Thin-film Transistors With High Field-Effect Mobility", Applied Physics Letters, vol. 82, No. 25, Jun. 23, 2003, pp. 4581-4583.

(Continued)

*Primary Examiner*—Anh Phung
*Assistant Examiner*—Michael Lulis
(74) *Attorney, Agent, or Firm*—Sughrue Mion, PLLC

(57) ABSTRACT

The present invention encompasses an organic field-effect transistor comprising an n-type organic semiconductor formed of a fullerene derivative having a fluorinated alkyl group which is expressed by the following chemical formula (wherein at least any one of $R_1$, $R_2$ and $R_3$ is a perfluoro alkyl group or a partially-fluorinated semifluoro alkyl group each having a carbon number of 1 to 20), and a field-effect transistor production method comprising forming an organic semiconductor layer using the fullerene derivative by a solution process, and subjecting the organic semiconductor layer to a heat treatment in an atmosphere containing nitrogen or argon or in vacuum to provide enhanced characteristics to the organic semiconductor layer. The present invention makes it possible to form an organic semiconductor layer by a solution process and provide an organic field-effect transistor excellent in electron mobility and on-off ratio and capable of operating even in an ambient air atmosphere.

7 Claims, 3 Drawing Sheets

U.S. PATENT DOCUMENTS

| | | | |
|---|---|---|---|
| 6,448,412 B1 * | 9/2002 | Murphy et al. | 506/15 |
| 7,247,548 B2 * | 7/2007 | Tada et al. | 438/542 |
| 2004/0175568 A1 * | 9/2004 | Takaguchi | 428/402 |
| 2005/0269563 A1 * | 12/2005 | Takaguchi | 257/40 |
| 2006/0093885 A1 * | 5/2006 | Krusic et al. | 429/33 |
| 2006/0204813 A1 * | 9/2006 | Hirakimoto et al. | 429/33 |
| 2007/0293693 A1 * | 12/2007 | Krusic et al. | 558/425 |

OTHER PUBLICATIONS

Christoph Waldauf et al., "Solution-Processed Organic n-Type Thin-Film Transistors", Advanced Materials, vol. 15, No. 24, Dec. 17, 2003, pp. 2084-2088.

Masayuki Chikamatsu et al., "Solution-Processed n-Type Organic Thin-Film Transistors With High Field-Effect Mobility", Applied Physics Letters, vol. 87, 2005, pp. 203504-1-203504-3.

* cited by examiner

Field-Effect Transistor

Field-Effect Transistor

Field-Effect Transistor

Field-Effect Transistor

Fig. 2  Field-Effect Transistor - Inventive Example 3

Fig. 3 Drain-Current v. Drain-Voltage Before Heat Treatment - Inventive Example 3
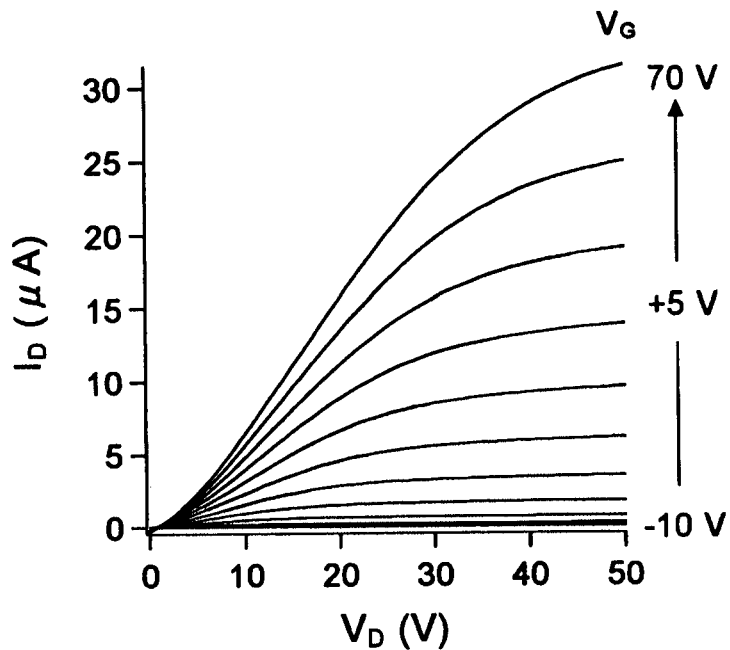
Fig. 4 Drain-Current v. Drain-Voltage After Heat Treatment - Inventive Example 3
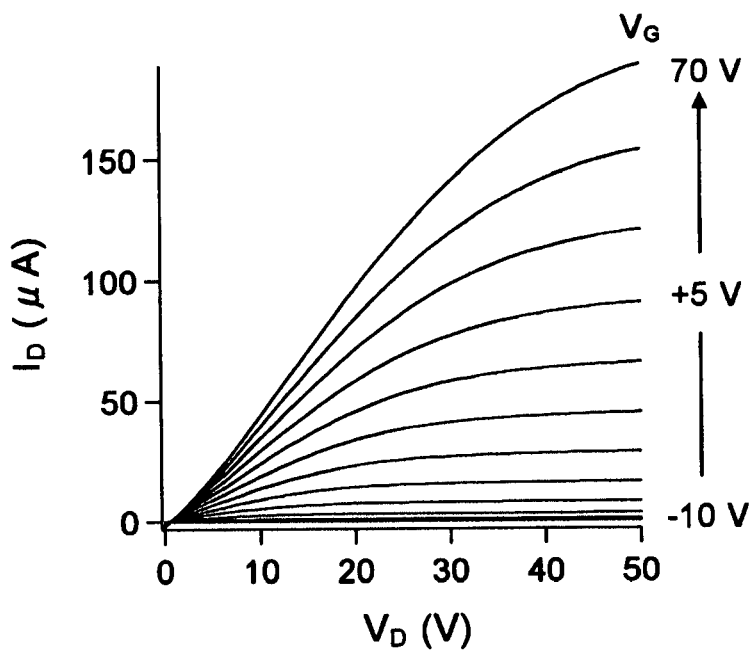

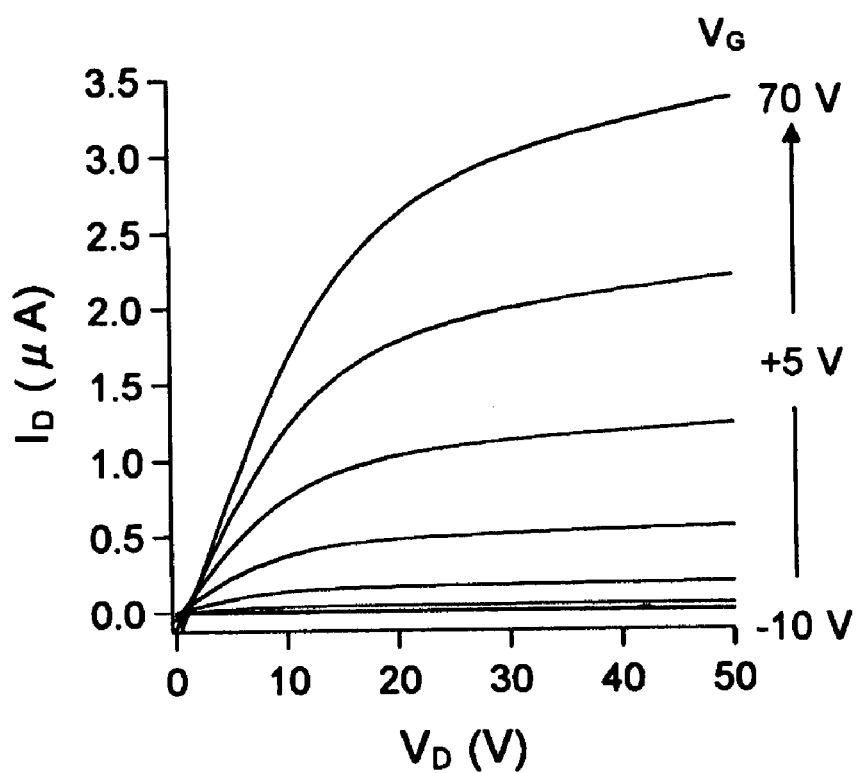
Fig. 5  Drain-Current v. Drain-Voltage After 24 hrs. from Introduction of Ambient Air - Inventive Example 3

ORGANIC SEMICONDUCTOR MATERIAL AND ORGANIC DEVICE USING THE SAME

This application claims priority to Japanese Application No. 2006-076111 filed on Mar. 20, 2006, the entire disclosure of which is incorporated herein.

BACKGROUND

1. Field

The embodiments of the present invention encompass a new fullerene derivative that is useful as an organic semiconductor material. The embodiments of the present invention also encompass an organic semiconductor device, particularly a field-effect transistor (hereinafter referred to as "FET"), using the fullerene derivative, and a method of producing the FET.

2. Related Art

Heretofore, it has been shown that fullerene, a soccer-ball-shaped carbon allotrope (hereinafter referred to as "C60"), exhibits distinguished n-type semiconductor characteristics among organic semiconductor materials, and a fullerene film formed by an ultrahigh vacuum process, such as molecular beam epitaxy, achieves an electron mobility equivalent to that of amorphous silicon. For example, see S. Kobayashi et al., "Fabrication and characterization of C60 thin-film transistors with high field-effect mobility", Applied Physics Letters, Vol. 82, No. 25, pp 4581-4583, (2003). In practice, it is difficult for such conventional film-forming techniques to increase the film-forming area and are more costly to produce. Thus, there is a need for developing a film-forming technique based on a coating process capable of contributing to increasing the film-forming area and reducing production cost.

The technique of producing an organic FET by a spin coating process using [6,6]-phenyl C61-butyric acid methyl ester (PCBM), a C60 derivative, is also known. For example, see Christoph Waldauf et al., "Solution-Processed Organic n-Type Thin-Film Transistors", Advanced Materials, Vol. 15, No. 24, pp 2084-2088 (2003).

The technique is also known of incorporating an alkyl chain to C60 to prepare C60-fused N-methylpyrrolidine-meta-C12 phenyl (C60MC12) as another C60 derivative so as to enhance crystallinity of a thin film to be formed, wherein C60MC12 exhibits a higher electron mobility (0.067 cm²/Vs) than that of PCBM. For example, see Japanese Patent Laid-Open Publication No. 2006-60169 (JP 2006-60169A); M. Chikamatsu et al., "Solution-processed n-type organic thin-film transistors with high field-effect mobility", Applied Physics Letters, Vol. 87, p 203504, (2005).

SUMMARY

Even though the characteristics of an organic FET using the conventional soluble fullerene derivative have been recently improved, they have problems such as insufficient values in electron mobility and on-off ratio, and incapability to operate in an ambient air atmosphere.

It is an object of the embodiments of the present invention to provide a fullerene derivative which has solubility in an organic solvent and exhibits excellent organic semiconductor characteristics, and to provide an organic FET using this material.

Embodiments of the present invention provide for a C60 derivative having a fluoroalkyl group that is soluble in an organic solvent and excellent in organic semiconductor characteristics. In particular, an n-type organic semiconductor material based on the C60 derivative having a fluoro alkyl group of the present invention can provide an organic FET exhibiting enhanced electron mobility and the capability to operate even in an ambient air atmosphere. It has also been found that the characteristics of an organic FET can be improved by subjecting a formed thin-film to a heat treatment under vacuum.

Specifically, according to a first embodiment of the present invention, a fullerene derivative having a fluorinated alkyl group is provided, wherein the fullerene derivative has the following chemical formula:

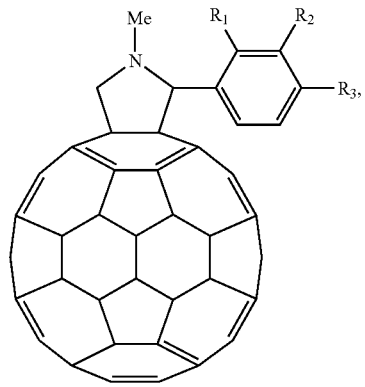

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

According to a second embodiment of the present invention, an organic semiconductor device comprising an n-type organic semiconductor layer is provided, comprising a fullerene derivative having a fluorinated alkyl group, wherein the fullerene derivative has the following chemical formula:

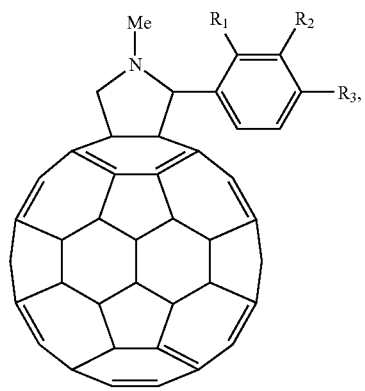

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

According to a third embodiment of the present invention, a field-effect transistor comprising an n-type organic semiconductor layer consisting of a fullerene derivative having a fluorinated alkyl group is provided, wherein the fullerene derivative has the following chemical formula:

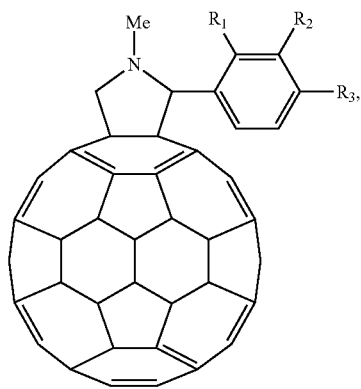

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

According to a fourth embodiment of the present invention, a method of producing a field-effect transistor comprising forming an organic semiconductor layer using a fullerene derivative having a fluorinated alkyl group is provided, wherein the fullerene derivative has the following chemical formula:

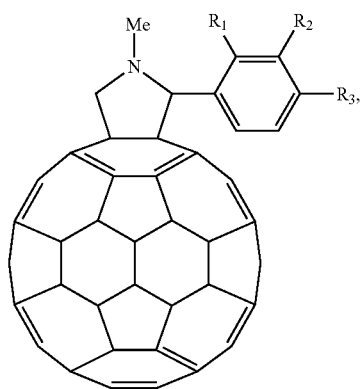

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20, and wherein the organic semiconductor layer is formed by a solution process.

According to a fifth embodiment of the present invention, a method of producing a field-effect transistor comprising forming an organic semiconductor layer using a fullerene derivative having a fluorinated alkyl group is provided, wherein the fullerene derivative has the following chemical formula:

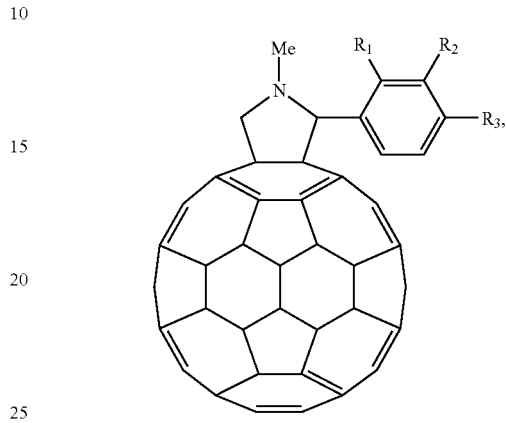

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20, and wherein the formed organic semiconductor layer is subjected to a heat treatment.

Preferably, in the method set forth in the fourth embodiment of the present invention, the organic semiconductor layer is heat-treated at a temperature of 50 to 200° C., and said treatment is applied in an atmosphere containing nitrogen or argon or in vacuum.

Also preferred in the method set forth in the fifth embodiment of the present invention, the organic semiconductor layer is heat-treated at a temperature of 50 to 200° C., and said treatment is applied in an atmosphere containing nitrogen or argon or in vacuum.

The embodiments of the present invention also encompass a new fullerene derivative, allowing for an organic semiconductor layer, particularly an n-type organic semiconductor layer, to be formed through a solution process to produce an organic semiconductor, particularly an n-type organic FET, which exhibits enhanced electron mobility and has the capability to operate even in an ambient air atmosphere. Thus, preferred embodiments of the present invention have a significant advantage of being able to facilitate increasing the film-forming area and reducing the cost of producing an organic semiconductor, particularly an n-type organic FET.

BRIEF DESCRIPTION OF THE DRAWINGS

FIG. 2 is a sectional view showing the configuration of a field-effect transistor in Inventive Example 3.

FIG. 3 is a graph showing the drain-current versus the drain-voltage before the heat treatment, as described herein in Inventive Example 3.

FIG. 4 is a graph showing the drain-current versus the drain-voltage after the heat treatment, as described herein in Inventive Example 3.

FIG. 5 is a graph showing the drain-current versus the drain-voltage after 24 hours from the introduction of ambient air, as described herein in Inventive Example 3.

DESCRIPTION

An organic semiconductor material encompassed by the present invention is a C60 fullerene derivative having a fluorinated alkyl group, which is expressed by the following Chemical Formula I:

Chemical Formula I

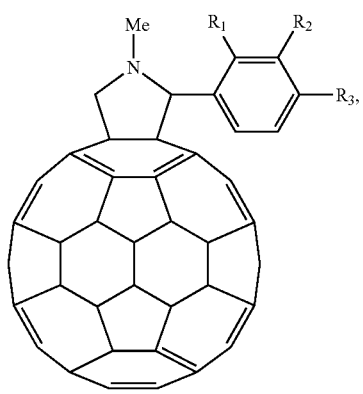

In Chemical Formula I, the substitution groups $R_1$, $R_2$, and $R_3$ each independently represent a hydrogen atom or an alkyl selected from the group consisting of a perfluoro alkyl group, a partially-fluorinated semifluoro alkyl group or an alkyl group each having a carbon number of 1 to 20, wherein each of the alkyl groups may have a straight-chain structure or a branched-chain structure, and at least one of the substitution groups $R_1$, $R_2$ or $R_3$ is a perfluoro alkyl group or a partially-fluorinated semifluoro alkyl group each having a carbon number of 1 to 20.

In the C60 derivative with a fluorinated alkyl group, which is expressed by the above Chemical Formula I, the perfluoro alkyl group or the partially-fluorinated semifluoro alkyl group each having a carbon number of 1 to 20 is added to a C60 derivative having a pyrrolidine skeleton, in a number of at least one and through an ortho-site, a meta-site or a para-site of a phenyl group.

The C60 derivative with a fluorinated alkyl group, which is expressed by the above Chemical Formula I, may be synthesized according to synthetic processes for a C60 derivative with a long-chain alkyl group, for example, as described in the dissertation by Dr. Masayuki CHIKAMATSU entitled, "Studies on Structure and Properties of Long Alkyl Chain-linked C60 Cast Films" (2001, Tokyo Metropolitan University). One example of a synthetic process can be expressed by the following Chemical Reaction I:

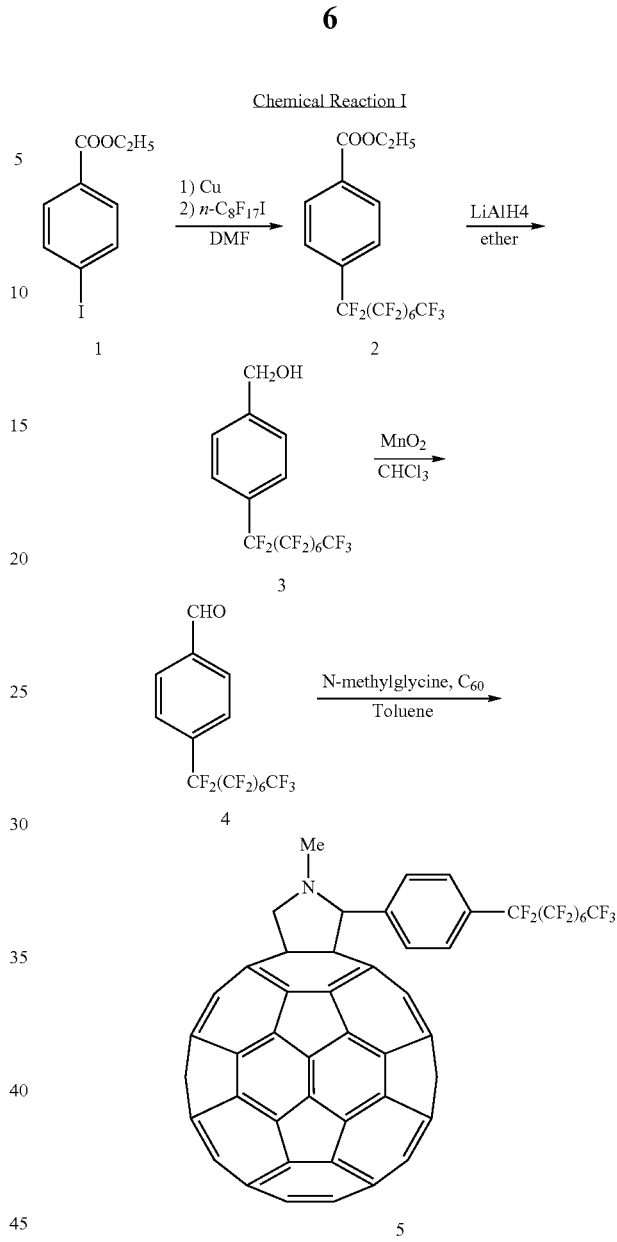

While a conventional C60-based FET can operate as a high-performance n-type organic FET in a vacuum atmosphere containing almost no oxygen and water or in an inert atmosphere, it cannot operate in an ambient air atmosphere. This is because oxygen and water existing in an ambient air atmosphere act as an electron trap and significantly hinder the electron transport function in an organic semiconductor. This phenomenon is not a problem peculiar to C60, but a common major problem in all n-type organic semiconductor materials.

In this respect, one embodiment of the present invention is that a C60 derivative has a fluorinated alkyl group, as shown in Chemical Formula I. As compared with an alkyl chain, a perfluoro alkyl chain has higher rigidity and stronger van der Waals interaction and thereby can be packed in a thin film densely and easily to have higher gas-barrier performance. Thus, it is believed that a perfluoro alkyl chain in the C60 derivative with a fluorinated alkyl group, as embodied by the present invention, effectively blocks oxygen and water molecules to allow an n-type organic FET using the C60 derivative to operate even in an ambient air atmosphere.

FIGS. 1(a) to 1(d) are sectional views showing typical examples of the arrangement of elements of a field-effect transistor.

Figure 1A:
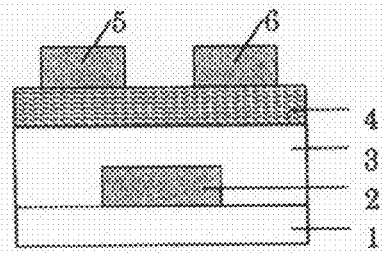
FIGS. 1(a) to 1(d) are sectional views showing typical examples of the arrangement of elements of a field-effect transistor.

In the FET illustrated in FIG. 1(a), an organic semiconductor layer 4 is located on a gate insulating film 3, and a source electrode 5 and a drain electrode 6 are located on the organic semiconductor layer 4.

Figure 1B:
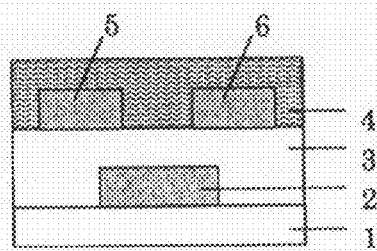

In the FET illustrated in FIG. 1(b), a source electrode 5 and a drain electrode 6 are located on a gate insulating film 3, and an organic semiconductor layer 4 is located on the source electrode 5 and the drain electrode 6.

Figure 1C:
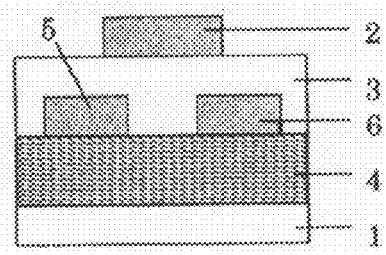

In the FET illustrated in FIG. 1(c), an n-type organic semiconductor layer 4 is located on a substrate 1, and a source electrode 5, a drain electrode 6, a gate insulating film 3 and a gate electrode 2 are located on the n-type organic semiconductor layer 4.

Figure 1D:
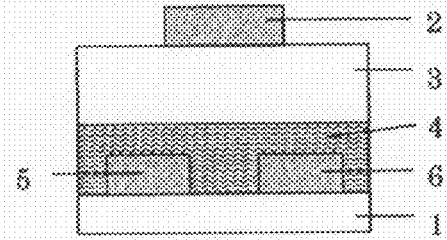
Figure 1D:
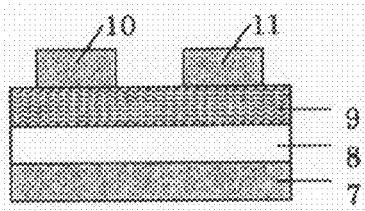

In the FET illustrated in FIG. 1(d), a source electrode 5 and a drain electrode 6 are located on a substrate 1, and an organic semiconductor layer 4, a gate insulating film 3 and a gate electrode 2 are located on the source electrode 5 and the drain electrode 6.

Another aspect of the present invention is that the C60 derivative with a fluorinated alkyl group expressed by the Chemical Formula I is formed as an organic semiconductor layer by a solution process.

Specifically, the C60 derivative with a fluorinated alkyl group, encompassed by Chemical Formula I, can be formed as the organic semiconductor layer 4 by a solution process, for example, by a spin coating process, a cast process, a dipping process, an ink jet process or a screen printing process. An advantage of the solution process is that it is able to form a film in a simplified manner compared to a process using no solution, such as a vacuum evaporation process. A solvent that can be used in the solution process can include, for example, chloroform, methylene chloride (dichloromethane), carbon disulfide, toluene, xylene, dichlorobenzene and trichlorobenzene.

The above process for forming the organic semiconductor layer consisting of the C60 derivative with a fluorinated alkyl group expressed by the Chemical Formula I is described as a preferred example, and a film or layer-formation process encompassed by the present invention is not limited to the disclosed process.

The source electrode 5 and the drain electrode 6 can be formed by a vacuum evaporation process, a sputtering process or the like, as would be understood by one of skill in the art. A metal for use in the source and drain electrodes may include, for example, gold, silver, platinum, chromium, aluminum, indium, alkali metals (Li, Na, K, Rb, Cs) and alkaline earth metals (Mg, Ca, Sr, Ba).

The substrate 1 may be, but is not limited to, a silicon substrate, a glass substrate or a plastic substrate, typified by a polyethylene terephthalate (PET) substrate.

A material for use in the gate electrode 2 may include, but is not limited to, p-doped silicon, n-doped silicon, indium-tin oxide (ITO), polythiophene or polyaniline polymer exhibiting high electrical conductivity by chemical doping, and metals, such as gold, silver, platinum and chromium.

Preferably, the gate insulating film 3 is made of a material having high isolation performance and dielectric constant. For example, the material may include, but is not limited to, inorganic materials, such as silicon oxide, silicon nitride, aluminum oxide, aluminum nitride and tantalum oxide, and organic materials, such as polyvinyl alcohol, polyvinyl phenol, polymethyl methacrylate and cyanoethylated pullulan.

After forming the organic semiconductor layer 4 by the solution process, the organic semiconductor layer 4 may be further subjected to a heat treatment, which can enhance electron mobility. The organic semiconductor layer 4 is heat-treated under given conditions, preferably, at a temperature of 50 to 200° C. in an atmosphere containing nitrogen or argon, or in vacuum. The heat treatment is typically set for a time period of from 1 to 20 hours.

While the above heat treatment conditions are set in a range efficient in a typical production process, a heat treatment condition in the present invention is not limited to any specific condition. For example, the above heat treatment conditions may be altered according to the need to perform the heat treatment at a temperature outside of the above temperature range.

The embodiments of the present invention are further described in the inventive examples and the comparative example below. It should be understood that the inventive examples and the comparative example disclosed herein are only examples, and are not intended to limit the present invention.

Inventive Example 1

Based on the scheme depicted by the above Chemical Reaction I, a C60 derivative (5) was synthesized in the following manner, as described below.

Each of the compounds 2, 3, 4 in the schemes described below were synthesized using a technique disclosed in "Tetrahedron", Vol. 53, No. 17, pp 6145 to 6162, (1997)".

Synthesis of ethyl 4-perfluorooctyl benzoate (2)

For the synthesis of ethyl 4-perfluorooctyl benzoate (2), a small amount of iodine (~0.01 g) was added to 300 ml of dimethylformamide solution suspending 53.7 g (0.845 mol) of activated copper, and then nitrogen gas was bubbled in the obtained solution while the solution was heated up to 130° C. During this process, 9.85 g (0.0357 mol) of ethyl 4-iodobenzoate and 25 g (0.0458 mol) of perfluorooctyl iodide were added to the solution, and the solution was stirred at 130° C. for 22 hours. Then, the solution was cooled to room temperature and subjected to extraction using ether. The extract obtained was rinsed with water, and then dehydrated using magnesium sulfide. After removing the magnesium sulfide by filtration, the solvent dimethylformamide was distilled away, and the crude product obtained was purified through a silica gel column chromatography process (using n-hexane as an eluting solvent). Then, the purified product was recrystallized using n-hexane to obtain 10.2 g (percent yield: 50.4%) of target compound, ethyl 4-perfluorooctyl benzoate (2). The structure of the ethyl 4-perflurorooctyl benzoate (2) was analyzed using a JEOL GSX-270 Spectrometer with the following spectroscopy settings:

1H-NMR (CDCl3) δ: 1.42 (3H, t), 4.42 (2H, q), 7.68 (2H, d), 8.18 (2H, d).

Synthesis of (4-perfluorooctyl phenyl)methanol (3)

For the synthesis of (4-perfluorooctyl phenyl)methanol (3), 1.02 g (27.0 mmol) of lithium aluminum hydride and 5.11 g (8.99 mmol) of the ethyl 4-perfluorooctyl benzoate (2) were added to 40 ml of dehydrated ether, and an obtained mixture was stirred at room temperature for 4 hours. Then, 20 ml of ethyl acetate was added to the mixture, and an ether layer was separated therefrom by filtration. Next, 40 ml of ether and 10 ml of water were added to the resulting residue, and the mixture that was obtained was then subjected to a reflux treatment for 1 hour. An ether layer was separated from the mixture, and combined with the previously separated ether layer. Then the ether was dehydrated using magnesium sulfide. After removing the magnesium sulfide by filtration, the solvent ether was distilled away, and the ether was recrystallized using n-hexane to obtain 4.00 g (percent yield: 84.4%) of target compound, (4-perfluorooctyl phenyl)methanol (3). The structure of the (4-perfluorooctyl phenyl)methanol (3) compound was analyzed using a JEOL GSX-270 Spectrometer with the following spectroscopy settings:

1H-NMR (CDCl3) δ: 1.80 (1H, t), 4.80 (2H, d), 7.51 (2H, d), 7.60 (2H, d).

Synthesis of 4-perfluorooctyl benzaldehyde (4)

For the synthesis of 4-perfluorooctyl benzaldehyde (4), 60 ml of chloroform was added to a mixture of 3.03 g (5.76 mmol) of the (4-perfulorooctyl phenyl)methanol (3) and 5.68 g of manganese dioxide. The solution obtained was subjected to a reflux treatment for 19 hours. After removing the manganese dioxide by filtration using Celite®, the solution obtained was condensed and recrystallized using methylene chloride/n-hexane to obtain 1.60 g (percent yield: 53.2%) of the target compound, 4-perfluorooctyl benzaldehyde (4). The structure of the 4-perfluorooctyl benzaldehyde (4) compound was analyzed using a JEOL GSX-270 Spectrometer with the following spectroscopy settings:

1H-NMR (CDCl3) δ: 7.79 (2H, d), 8.04 (2H, d), 10.1 (1H, s).

Synthesis of C60 Derivative (5)

For the synthesis of C60 derivative (5), 1.13 g (2.16 mmol) of 4-perfluorooctyl benzaldehyde (4), 214 mg (2.40 mmol) of N-methyl glycine and 506 mg (0.701 mmol) of C60 were added to 300 ml of toluene. The obtained solution was subjected to a reflux treatment for 18 hours, and then cooled to room temperature. Next, the solution was subjected to filtration, and then the solvent toluene was distilled away. The product obtained was then subjected to a high-speed liquid chromatography process (Buckyprep column; eluting solvent: n-hexane) to obtain 153 mg (percent yield: 17.2%) of the target compound, C60 derivative. The structure of the C60 derivative (5) compound was analyzed using a JEOL GSX-270 Spectrometer with the following spectroscopy settings:

1H-NMR (CDCl3) δ: 2.82 (3H, s), 4.30 (1H, d), 5.02 (2H, t), 7.66 (2H, d), 7.97 (2H, s)

The mass to charge [m/z] ratio of the C60 derivative (5) was also measured using a JEOL MS600H Mass Spectrometer with the following settings:

FAB-Mass: m/z 1272 (M+).

Inventive Example 2

Based on a scheme expressed by the following Chemical Reaction II, a C60 derivative (7) was synthesized. A compound (6) was synthesized in a similar manner to the synthesis described above with respect to 4-perfluorooctyl benzaldehyde (4).

The synthesis of the C60 derivative (7) is shown by the following Chemical Reaction II:

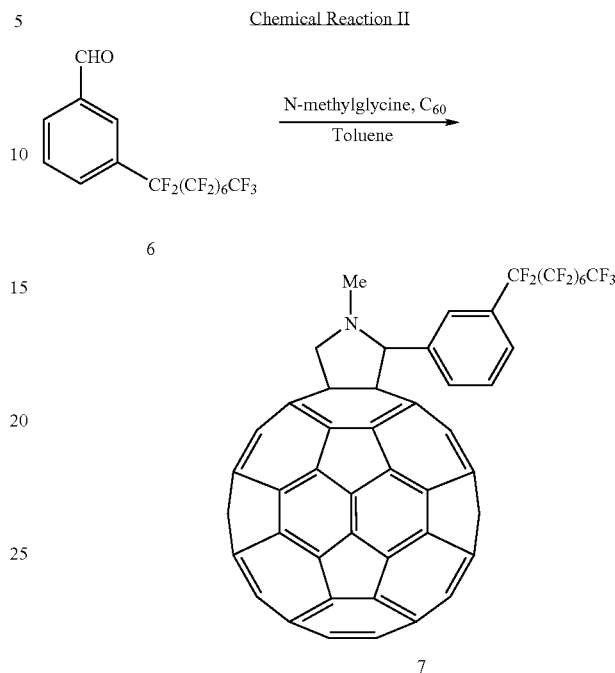

Synthesis of C60 Derivative (7)

For the synthesis of C60 derivative (7), 725 mg (1.38 mmol) of the above compound (6), 135 mg (1.51 mmol) of N-methyl glycine and 1.00 g (1.39 mmol) of C60 were added to 350 ml of toluene. The solution that was obtained was subjected to a reflux treatment for 18 hours, and then cooled to room temperature. The solution was subjected to filtration, and then the solvent toluene was distilled away. The product obtained was then subjected to a high-speed liquid chromatography process (Buckyprep column; eluting solvent: n-hexane) to obtain 152 mg (percent yield: 8.67%) of the target compound, C60 derivative (7). The structure of the C60 derivative (7) compound was analyzed using a JEOL GSX-270 Spectrometer with the following spectroscopy settings:

1H-NMR (CDCl3) δ: 2.82 (3H, s), 4.31 (1H, d), 5.02 (2H, t), 7.58 (2H, d), 8.03 (2H, s)

The mass to charge [m/z] ratio of the C60 derivative (7) was also measured using a JEOL MS600H Mass Spectrometer with the following settings:

FAB-Mass: m/z 1272 (M+).

Inventive Example 3

In Inventive Example 3, a field-effect transistor having a sectional configuration illustrated in FIG. 2 was prepared in the following manner.

A p-type doped silicon substrate 7 formed with a silicon oxide film 8 having a thickness of 300 nm was immersed in hexamethyldisilazane for about 1 hour. Then, the substrate was subjected to an ultrasonic cleaning treatment using chloroform for about 20 minutes. The p-type doped silicon substrate 7 was designed to serve as both a substrate and a gate electrode.

A C60 derivative encompassed by the following Chemical Formula II:

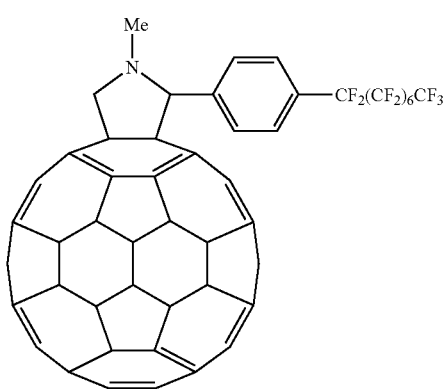

Chemical Formula II was dissolved in chloroform while adjusting a concentration thereof at 10 mg/ml.

The C60 derivative expressed by the Chemical Formula II is a compound in which a perfluorooctyl chain is added to a C60 derivative having a pyrrolidine skeleton, through a parasite of a phenyl group.

After the hexamethyldisilazane treatment, the solution was applied onto the silicon oxide film 8 through a spin coating process to form a C60 derivative layer 9. The spin coating process was performed under the following conditions: 500 rpm for 5 sec, and 2000 rpm for 60 sec. Then, gold was deposited on the C60 derivative layer 9 through a vacuum evaporation process to form a source electrode 10 and a drain electrode 11.

A channel width and a channel length were set at 5 mm and 20 μm, respectively. A gold wire was then connected to the transistor using silver paste in an ambient air atmosphere, and the transistor was set in a cryostat to evaluate the characteristics of the transistor at room temperature, while evacuating air from the cryostat. A degree of vacuum was in the range of about $10^{-6}$ to $10^{-7}$ Torr.

FIG. 3 shows a drain-current vs. drain-voltage characteristic before a heat treatment. As seen in FIG. 3, the transistor could achieve an n-channel enhancement-type characteristic where a drain current becomes higher as a positive gate voltage is increasingly applied.

This transistor was heated at 100° C. in vacuum for 15 hours. FIG. 4 shows a drain-current vs. drain-voltage characteristic after the heat treatment.

Under the conditions of Vd=50V and Vg=70V, while a drain current before the heat treatment was 32 μA, a drain current after heat treatment was largely increased to 189 μA. This was done because the heat treatment in vacuum allows residues in the formed thin film, such as organic solvent, oxygen and water, which hinder electron transport, to be removed therefrom, and can improve crystallinity of the thin film. The electron mobility was calculated from a drain current in a saturation region (Vd=50V). The electron mobilities before and after the heat treatment were 0.013 cm$^2$/Vs and 0.067 cm$^2$/Vs, respectively. These values demonstrate that the electron mobility was improved by the heat treatment. A threshold voltage and an on-off ratio after the heat treatment were 22.0 V and $2\times10^5$, respectively. As compared with corresponding values (25.7 V and $3\times10^4$) before the heat treatment, the threshold voltage was lowered, and the on-off ratio was increased.

FIG. 5 shows the drain-current versus the drain-voltage of the transistor, measured at room temperature in an ambient air atmosphere after 24 hours from a time when ambient air was introduced in the cryostat. Although a lowering in the drain current was observed, the n-channel enhancement-type characteristic was adequately maintained. The electron mobility, the threshold voltage and the on-off ratio were 0.004 cm$^2$/Vs, 45.0V and $3\times10^3$, respectively.

Comparative Example 1

The transistor in Comparative Example 1 was prepared in the same manner as that in Inventive Example 3, except that the C60 derivative layer 9 in the field-effect transistor having the sectional configuration illustrated in FIG. 2, was formed of [6, 6]-PCBM, as depicted by the following Chemical Formula III:

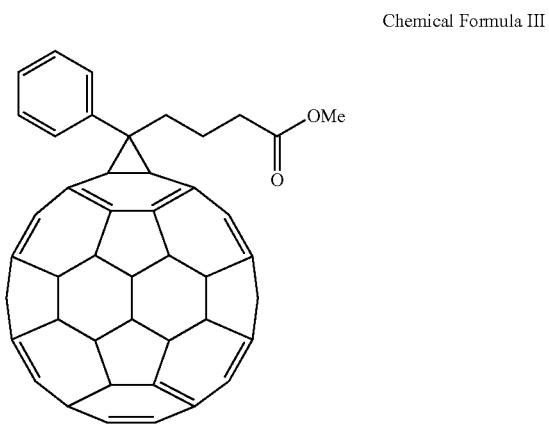

Chemical Formula III

After performing a measurement in vacuum, the transistor was heated at 100° C. for 15 hours in vacuum. An electron mobility, a threshold voltage and an on-off ratio each measured at room temperature in vacuum after the heat treatment were 0.025 cm$^2$/Vs, 33.2V and $2\times10^4$, respectively. Ambient air was then introduced in the cryostat, and characteristics of the transistor were measured. In this comparative example, no FET characteristic was observed.

As described above with respect to the inventive examples, it was verified that the fluorooctyl chain effectively provides a high gas barrier performance to the C60 derivative layer 9 so as to allow the n-type organic FET in Inventive Example 3 to exhibit excellent characteristics even in an ambient air atmosphere.

INDUSTRIAL APPLICABILITY

The organic semiconductor material embodied by the present invention can be used as a part of an organic FET, a thin-film solar cell, a photoelectric transducer, a memory device, a light-emitting device or a diode.

The organic FET of the present invention using the above material can be used as a part of a thin-film transistor for driving, in an active-matrix manner, a flat-panel display, such as a liquid-crystal display, an electronic paper or an organic electroluminescence (EL) display, a wireless IC tag or a complementary MOS (CMOS) circuit.

It is contemplated that one of ordinary skill in the art may make numerous modifications to the compounds, devices, and methods described herein.

What is claimed is:

1. A fullerene derivative having a fluorinated alkyl group, wherein the fullerene derivative has the following chemical formula:

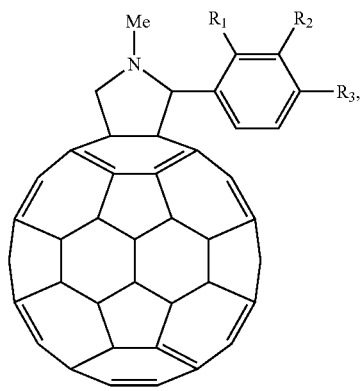

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

2. An organic semiconductor device comprising an n-type organic semiconductor layer, comprising a fullerene derivative having a fluorinated alkyl group, wherein the fullerene derivative has the following chemical formula:

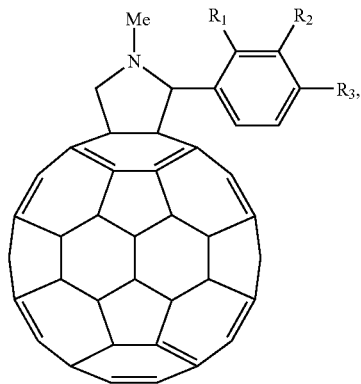

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

3. A field-effect transistor comprising an n-type organic semiconductor layer consisting of a fullerene derivative having a fluorinated alkyl group, wherein the fullerene derivative has the following chemical formula:

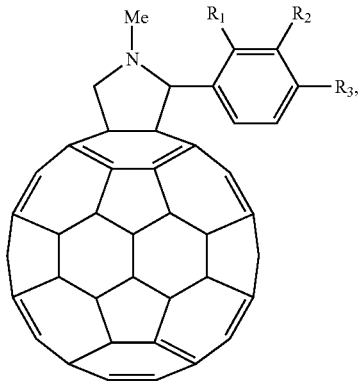

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20.

4. A method of producing a field-effect transistor comprising forming an organic semiconductor layer using a fullerene derivative having a fluorinated alkyl group, wherein the fullerene derivative has the following chemical formula:

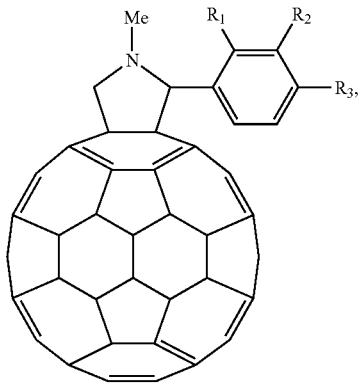

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20, and wherein the organic semiconductor layer is formed by a solution process.

5. A method of producing a field-effect transistor comprising forming an organic semiconductor layer using a fullerene derivative having a fluorinated alkyl group, wherein the fullerene derivative has the following chemical formula:

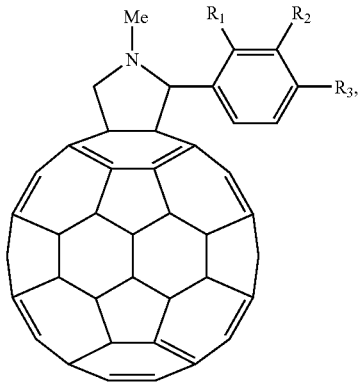

wherein $R_1$, $R_2$ and $R_3$ each independently represents a hydrogen atom or is an alkyl selected from the group consisting of a perfluoro alkyl group, a partially-fluorinated semifluoro alkyl group or an alkyl group each having a carbon number of 1 to 20, wherein each of said alkyl groups has a straight-chain structure or a branched-chain structure, and at least one of $R_1$, $R_2$ or $R_3$ is a perfluoro alkyl group or a partially-fluorinated semifluoro alkyl group, each having a carbon number of 1 to 20, and wherein the formed organic semiconductor layer is subjected to a heat treatment.

6. The method as defined in claim 4, wherein the organic semiconductor layer is heat-treated at a temperature of 50 to 200° C., and wherein said treatment is applied in an atmosphere containing nitrogen or argon or in vacuum.

7. The method as defined in claim 5, wherein the organic semiconductor layer is heat-treated at a temperature of 50 to 200° C., and wherein said treatment is applied in an atmosphere containing nitrogen or argon or in vacuum.

* * * * *